US009966873B2

(12) United States Patent
Zhang

(10) Patent No.: US 9,966,873 B2
(45) Date of Patent: May 8, 2018

(54) ACTIVE SWITCHING RECTIFIER EMPLOYING MOSFET AND CURRENT-BASED CONTROL USING A HALL-EFFECT SWITCH

(71) Applicant: Yiqiang Jake Zhang, Vancouver (CA)

(72) Inventor: Yiqiang Jake Zhang, Vancouver (CA)

(*) Notice: Subject to any disclaimer, the term of this patent is extended or adjusted under 35 U.S.C. 154(b) by 140 days.

(21) Appl. No.: 14/458,079

(22) Filed: Aug. 12, 2014

(65) Prior Publication Data
US 2016/0049856 A1 Feb. 18, 2016

(51) Int. Cl.
H02M 7/21 (2006.01)
H02M 7/217 (2006.01)
H02M 1/00 (2006.01)
H02M 7/797 (2006.01)
H02M 7/219 (2006.01)

(52) U.S. Cl.
CPC ........... *H02M 7/217* (2013.01); *H02M 7/797* (2013.01); *H02M 2001/0006* (2013.01); *H02M 2001/0009* (2013.01); *H02M 2007/2195* (2013.01); *Y02B 70/1408* (2013.01)

(58) Field of Classification Search
CPC ......... H02M 7/217; H02M 2001/0009; H02M 7/797
See application file for complete search history.

(56) References Cited

U.S. PATENT DOCUMENTS 3,995,210 A 11/1976 Milkovic
5,450,000 A 9/1995 Olsen
8,320,143 B2 11/2012 Leibovitz
8,542,011 B2* 9/2013 Chen .................. 324/207.12
2005/0224248 A1 10/2005 Gagnon et al.
2010/0301791 A1* 12/2010 Watanabe .............. H02M 1/32
318/400.35

(Continued)

FOREIGN PATENT DOCUMENTS

EP 2629411 A1 8/2013

OTHER PUBLICATIONS

Linear Technology Corporation, "LT4320/LT4320-1 Ideal Diode Bridge Controller", 2013, Milpitas, California.

(Continued)

*Primary Examiner* — Fred E Finch, III
*Assistant Examiner* — Rafael O De Leon Domenech
(74) *Attorney, Agent, or Firm* — Chen Yoshimura LLP

(57) ABSTRACT

An active switching rectifier circuit uses a MOSFET and applies a current based control to turn the MOSFET on and off. The MOSFET has its source and drain connected between an AC phase line and the DC output. A current detection and control circuit has an input current conductor coupled in series with the source-drain current of the MOSFET; it outputs a switching control signal based on the current in its input conductor and applies the signal to the gate of the MOSFET for on/off control. A Hall-effect switch may be used in the current detection and control circuit. The rectifier may also include a voltage supply circuit coupled to the AC source for supplying a floating DC voltage to the current detection and control circuit. The rectifier circuit can be adapted for various configurations including single-phase half-wave, center-tap dual-phase full-wave, single-phase full-wave, and three-phase full-wave.

9 Claims, 7 Drawing Sheets

(56) References Cited

U.S. PATENT DOCUMENTS

| | | | | |
|---|---|---|---|---|
| 2011/0199799 A1* | 8/2011 | Hui | ...................... | H02M 7/219 363/127 |
| 2012/0249124 A1* | 10/2012 | Ionescu | ................ | G01R 33/072 324/207.2 |
| 2012/0281444 A1* | 11/2012 | Dent | ...................... | H02M 1/32 363/56.01 |
| 2013/0063981 A1 | 3/2013 | Dujic et al. | | |
| 2014/0129850 A1 | 5/2014 | Paul | | |
| 2015/0023079 A1 | 1/2015 | Sawada et al. | | |
| 2015/0180493 A1* | 6/2015 | Liu | ...................... | H03M 1/002 324/686 |
| 2015/0303843 A1* | 10/2015 | Fuwa | .................... | H02P 6/182 318/400.38 |

OTHER PUBLICATIONS

Honeywell, "Hall Effect Sensing and Application", Micro Switch Sensing and Control, Freeport, Illinois.

Allegro MicroSystems, LLC"A1101, A1102, A1103, A1104, and A1106 Continuous-Time Switch Family", 2006-2014, Worcester, Massachusetts.

International Rectifier, "IR2101(S)/IR2102(S) & (PbF) High and Low Side Driver", Apr. 2, 2004, El Segundo, California.

International Rectifier, "IR2103(S)PBF Half-Bridge Driver", Apr. 18, 2013, El Segundo, California.

Texas Instruments, "LM2747,LM3100,LM5035, Synchronous Rectification in High-Performance Power Converter Design", Literature No. SNVA595, 2011, Dallas, Texas.

Giacomini et al., "A novel high efficient approach to input bridges", Presented at PCIM Europe, May 27-29, 2008, Nuremberg, Germany.

International Search Report in a counterpart PCT application No. PCT/CA2015/050752, dated Nov. 16, 2015.

Written Opinion in a counterpart PCT application No. PCT/CA2015/050752, dated Nov. 16, 2015.

Chinese Office Action, dated Dec. 6, 2016 , in a counterpart Chinese patent application, No. CN 201510263371.3.

\* cited by examiner

ACTIVE SWITCHING RECTIFIER EMPLOYING MOSFET AND CURRENT-BASED CONTROL USING A HALL-EFFECT SWITCH

BACKGROUND OF THE INVENTION

Field of the Invention

This invention relates to a rectifier circuit, and in particular, it relates to an active switching rectifier circuit employing MOSFETs with current-based control.

Description of the Related Art

Conventional AC to DC rectifying circuits employ diodes by utilizing the diode's P-N junction single direction conductivity. When a relatively small current passes through the diode, the normal diode will have a 0.7V voltage drop across the diode (or about 0.3V for Schottky type diodes). The voltage drop can be up to 1.0V or higher when a relatively high current, such as 100 A or 200 A, passes through the diode. The power loss over the diode will be 100 W or 200 W or more in such situations. Thus, in high current rectifier applications, such as those encountered in alternators in automobiles and other applications, power loss can be significant. In high current rectifier applications, such as 150 A or higher in a 125 C. environment, the heat generated from diode power loss can greatly reduce the reliability and efficiency of the equipment.

MOSFETs (Metal Oxide Semiconductor Field Effect Transistors), in particular power MOSFETs, have been used in rectifier circuits due to their relatively small internal on resistance. For example, a chip made by Linear Technology, model number LT4320/LT4320-1, is intended to be used to control a diode bridge made of four N-channel MOSFETs. In another example, U.S. 20140129850 (assigned to Linear Technology) shows an active MOSFET bridge circuit; paragraph [0048] of that application describes that the MOSFETs are controlled by comparators or passive circuitry to turn on MOSFETs on and off by detecting the incoming voltage polarity. This type of MOSFET control circuits tend to be complex, and have the disadvantage that voltage detection may become unreliable in applications that involve dynamic inductive or capacitive load.

SUMMARY OF THE INVENTION

The present invention is directed to an active switching rectifier circuit and related method which employ MOSFETs and which control the MOSFETs based on current detection.

An object of the present invention is to provide a rectifier circuit for high current application that is efficient and has a simple structure.

Additional features and advantages of the invention will be set forth in the descriptions that follow and in part will be apparent from the description, or may be learned by practice of the invention. The objectives and other advantages of the invention will be realized and attained by the structure particularly pointed out in the written description and claims thereof as well as the appended drawings.

To achieve these and other advantages and in accordance with the purpose of the present invention, as embodied and broadly described, the present invention provides a current detection device which includes: a ferromagnetic core defining a gap; a conductor wound around the core, wherein the core generates a magnetic field within the gap when a current flows through the conductor; and a Hall-effect switch disposed inside the gap, wherein the Hall-effect switch generates an ON and OFF signal during a half cycle of an AC or half wave current passing through the conductor.

In another aspect, the present invention provides a circuit for rectifying an AC voltage from an AC source to generate a DC voltage on a DC output, which includes: a MOSFET (Metal Oxide Semiconductor Field Effect Transistor) having its source and drain electrodes coupled between a phase line of the AC source and one end of the DC output for passing a current between the source and the drain electrodes; a current detection and control circuit having an input current conductor which is coupled in series with the current that passes between the source and the drain electrodes of the MOSFET, the current detection and control circuit outputting a switching control signal based on a current in the input current conductor, wherein the switching control signal is coupled to a gate electrode of the MOSFET to turn the MOSFET on and off based on the switching control signal; and a voltage supply circuit coupled to the AC source for generating a DC operating voltage and supplying it to the current detection and control circuit.

The rectifying circuit can be applied in single-phase half-wave, center-tap dual-phase full-wave, single-phase full-wave, and three-phase full-wave configurations.

In another aspect, the present invention provides a circuit for rectifying a three-phase AC voltage on an AC source having three phase lines to generate a DC voltage on a DC output, which includes: first to sixth MOSFETs (Metal Oxide Semiconductor Field Effect Transistors), wherein the first to third MOSFETs have their source electrodes respectively coupled to one of the phase lines of the AC source and their drain electrode coupled to a first end of the DC output, and the fourth to sixth MOSFETs respectively have their source electrodes coupled to another end of the DC output and their drain electrode respectively coupled to one of the phase lines of the AC source, wherein the first and fourth, second and fifth, and third and sixth MOSFETs respectively form first to third half-bridges; first to third half-bridge driver circuits respectively providing drive signals to gate electrodes of MOSFETs of the respective first to third half-bridges to turn the MOSFETs on and off, the first to third half-bridge driver circuits being configured to receive control signals from an external control unit; and first to sixth current detection and control circuits, each having an input current conductor which is coupled in series with source to drain current of a corresponding one of the first to sixth MOSFETs, wherein the first to sixth current detection and control circuits receive a common input DC voltage as an operating voltage, wherein each current detection and control circuit outputs a switching control signal based on a current in its input current conductor when the input DC voltage is at an enabling level, and outputs a constant OFF signal when the input DC voltage is at a disabling level, and wherein the switching control signal from the first and fourth, second and fifth, and third and sixth current detection and control circuits are respectively inputted to the first to third half-bridge driver circuits.

It is to be understood that both the foregoing general description and the following detailed description are exemplary and explanatory and are intended to provide further explanation of the invention as claimed.

DETAILED DESCRIPTION OF THE PREFERRED EMBODIMENTS

Embodiments of the present invention provide active switching rectifier circuits for AC-DC rectification applicable to various AC configuration such as single-phase half-wave, center-tap dual-phase full-wave, single-phase full-wave, three-phase full-wave, etc. Each rectifier circuit for these various configurations contains three main components: a MOSFET to achieve the rectifying function, a current detection and control circuit which detects the current level that flows through MOSFET to generate an on/off control signal for the MOSFET, and a voltage supply circuit to supply an operating voltage to the current detection and control circuit.

Figure 1:
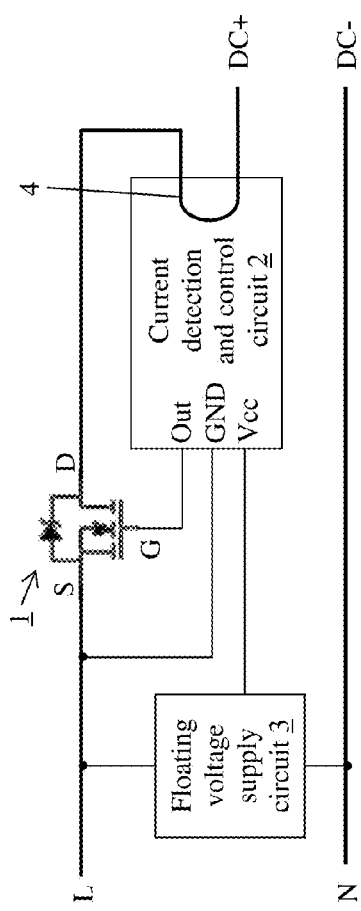
FIG. 1 schematically illustrates an active switching rectifier circuit using a MOSFET according to a first embodiment of the present invention.

FIG. 1 is a schematic diagram showing an active switching rectifier circuit according to a first embodiment of the present invention, in a single phase half wave configuration. The active switching rectifier circuit includes a MOSFET 1, which is preferably an N-channel power MOSFET, a current detection and control circuit 2, and a voltage supply circuit 3. The AC input for this circuit is a single phase AC source having a phase line L and neutral line N. The source electrode S of the MOSFET 1 is coupled to the input phase line L and its drain electrode D is coupled to the positive DC output DC+. The AC neutral line N acts as the negative DC output DC−. The DC load is connected between DC+ and DC−. The current that passes through the MOSFET 1 flows through an input conductor 202 of the current detection and control circuit 2. The current detection and control circuit 2 does not have any electrical element on the current path except for the conductor 202 itself, which has a negligible resistance. The current detection and control circuit 2 generates a control signal Out which is applied to the gate electrode G and of the MOSFET 1, to control the turning on and off of the MOSFET. The ground GND of the current detection and control circuit 2 is coupled to the source S of the MOSFET 1 (i.e. the input phase line L). The voltage supply circuit 3 is coupled between the AC input lines L and N, and supplies a working voltage to the current detection and control circuit 2 at Vcc.

It should be noted that the current detection and control circuit 2 can alternatively take its input current before the source S of the MOSFET 1; i.e., the input current conductor 202 of the current detection and control circuit 2 is connected in series with the MOSFET, either before or after the MOSFET.

A P-channel MOSFET may be used in lieu of the N-channel MOSFET, although N-channel devices are preferred because they have lower internal resistance, can handle larger current and are less costly.

The principle of the rectifier circuit shown in FIG. 1 is as follows.

As shown in FIG. 1, the internal body diode between the source S and drain D of the MOSFET 1 is forward biased during the positive half cycle of the AC voltage if the MOSFET is turned off, and the current will flow through the body diode; during the positive half cycle if the MOSFET is turned on, the current will flow through the channel of the MOSFET. Thus, a current flows between the MOSFET's source and drain during the positive half cycle regardless of whether the MOSFET is turned on. This current flows through the current detection and control circuit 2. The current detection and control circuit 2 is designed to detect a current level in the input conductor 202, and generate an "on" control signal to turn on the MOSFET 1 when the current level rises to and above a first predetermined threshold value, and generate an "off" control signal to turn off the MOSFET 1 when the current drops to and below a second predetermined threshold value. The first and second threshold values may be the same or different, as discussed in more detail later. Preferably, the threshold current values are relatively low values, such as a few amps, e.g. about 5 A, while the working current of the AC source may have a peak value of 100 A or higher.

Thus, the current flows through the MOSFET 1 during the positive half cycle of the AC voltage, either through the internal body diode when the current level is low and the MOSFET is turned off, or through the channel (the internal resistance) between source and drain when the current is high and the MOSFET is turned on. When the MOSFET is turned off and the current flows through the body diode, the device functions as a diode and experiences a voltage drop associated with the diode (e.g. 0.7V). While this causes a power loss, the loss is relatively small because the current is low (e.g. 5 A). When the current rises to and above the first threshold current (e.g. 5 A), the MOSFET is turn on and all current flows through the MOSFET channel due to the small on resistance (the S-D voltage is far below the 0.7V required for the body diode to conduct).

Figure 2:
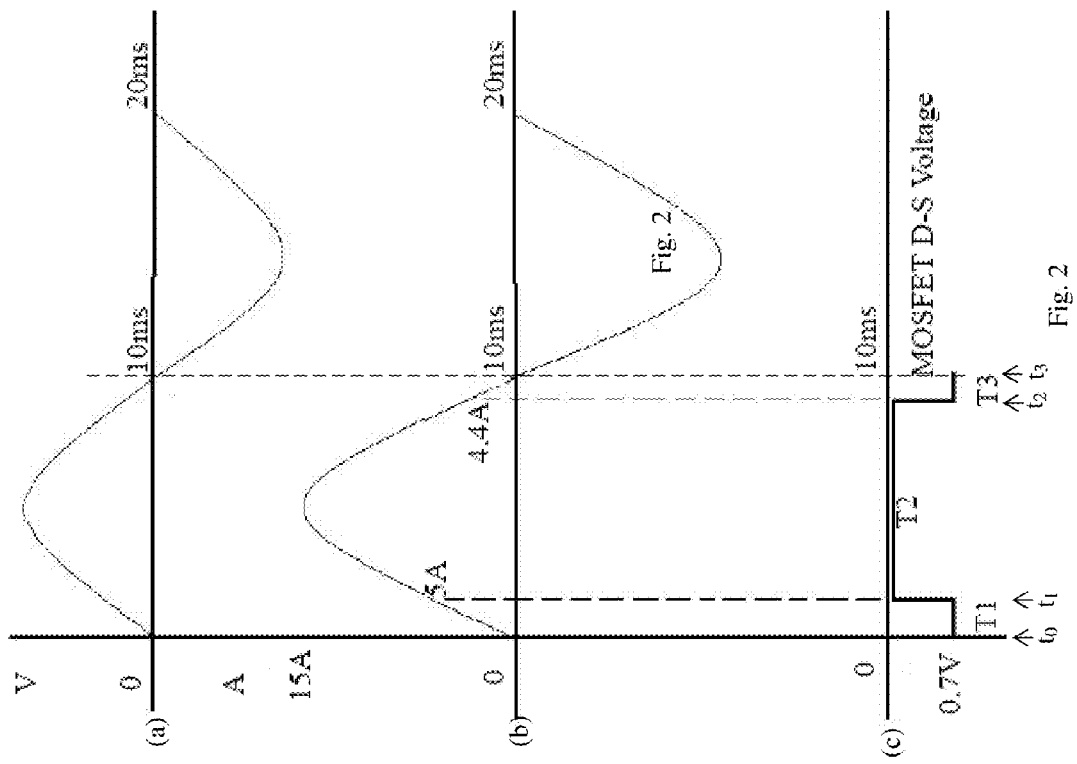
FIG. 2 schematically illustrates a Hall-effect switch used for current detection in embodiments of the present invention.

FIG. 2 is a waveform diagram illustrating the ON and OFF signals generated by the current detection and control circuit 2. Waveform (a) represents an exemplary voltage signal of the input AC voltage (50 Hz in this example), and waveform (b) represents the corresponding current in the conductor 202 (i.e. the current that flows through the MOSFET 1, either through the body diode or the source to drain channel). For a given input voltage, the current is primarily determined by the load (the voltage drop of the MOSFET body diode during the off period of the MOSFET being relatively low). In this particular example, the current in waveform (b) has an average of about 15 A rms.

As sown in FIG. 2, during the positive half cycle of the AC voltage, the current rises from 0 A at the zero crossing time point $t_0$ (V=0) to a first threshold current (about 5 A in this example) at time point $t_1$, when the current detection and control circuit 2 detects this current and outputs an ON signal to turn on the MOSFET. The MOSFET stays on, until time point $t_2$ when the current drops to a second threshold current, at which time the current detection and control circuit 2 detects this current and outputs an OFF signal to turn off the MOSFET.

During the time period T1 between $t_0$ and $t_1$, the current detection and control circuit 2 continues to output an OFF signal and the MOSFET remains off, so the current flows through the body diode, resulting in a voltage drop of 0.7V across the source and drain. During the time period T2 between $t_1$ and $t_2$, the MOSFET remains on and the current flows through the source to drain channel, resulting in very low voltage drop. The on resistance of a power MOSFET is typically in the milliohm range or below, so the voltage drop for a 15 A rms current is negligible (in FIG. 2, the voltage during time period T2 is schematically shown as a flat line close to zero). During time period T3 between time point $t_2$ and the next zero crossing point $t_3$, the MOSFET remains off, and as a result, the body diode is forward biased and current flows through the body diode, resulting in a 0.7V voltage drop.

During the negative half cycle of the AC voltage, the body diode of the MOSFET is reverse biased and does not conduct. Since the MOSFET has been turned off, no current flows through the channel of the MOSFET either. Thus, no current flows in the conductor 202 during the negative half cycle; as a result, the current detection and control circuit 2 continues to output an off control signal which keeps the MOSFET 1 turned off. The process repeats for the next cycle of the AC voltage.

To summarize, the current detection and control circuit 2 controls the power MOSFET 1 to function as an active switching rectifier within a half sine wave; the MOSFET is turned on and then turn off at two time points within each positive half sine wave (not at zero crossing).

An advantage of this control method is that there is no need to detect the zero crossing point and can work completely within the positive half cycle. Detecting the zero crossing requires detecting the signal both before and after the zero crossing (i.e. during both the negative and positive half cycles).

The threshold currents of the current detection and control circuit 2 can be pre-determined by the design of the circuit. For given threshold current values, the MOSFET's on period T2 will be longer for higher AC current. For applications involving a high current, the threshold current values may be designed to be correspondingly higher.

As pointed out earlier, the current detection and control circuit 2 does not have a resistive element on the current path of the output current of the MOSFET 1. It generates the control signal for the MOSFET 1 based on current detection, rather than voltage detection. In a preferred embodiment, the current detection and control circuit 2 employs a magnetic core and a Hall-effect switch element, an example of which is schematically illustrated in FIG. 3.

Figure 3:
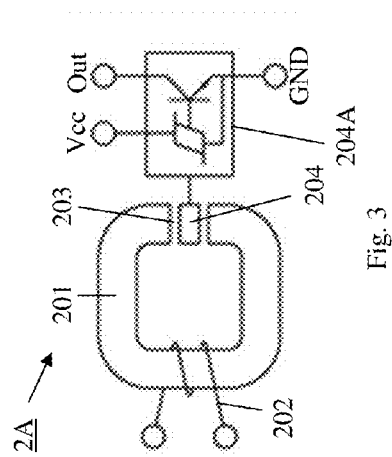
FIG. 3 schematically illustrates waveforms of various voltage and current signals in embodiments of the present invention.

The current detection and control circuit 2A shown in FIG. 3 includes a core 201 with the conductor (coil) 202 wound around it. The core is made of a suitable ferromagnetic material; for example, a silicon steel lamination stack is preferred due to its low remanence and high permeability. The coil is connected to the current which flows through the MOSFET (see FIG. 1). The coil 202 can be wound around the core 201 for a desired number of turns (passing through the core once will be one turn). The coil conductor should be sufficiently large to handle large current. The core 201 is preferably C shaped, forming a gap (opening) 203, where a magnetic field is generated in the gap when a current (AC or DC) flows through the coil 202. The magnetic field varies with the current in the coil 202 without significant delay. For a given current value in the coil 202, the magnetic flux density (Gauss) generated in the gap 203 depends on the number of turns of the coil, the material of the core, the size of core, and the opening distance of the gap. More turns of the coil, larger sized core will, and smaller gap will result in higher magnetic flux density.

A Hall-effect switch 204 is disposed within the magnetic field in the gap 203. In FIG. 3, the box 204A schematically depicts a simplified version of the internal circuit and pins of the Hall-effect switch 204; the physical form of the Hall-effect switch typically consist of a small body to be inserted into the magnetic field e.g. the gap 203, and a number of pins extending from the body. In the example of FIG. 3, the pins of the Hall-effect switch are labeled to correspond to the terminals of the current detection and control circuit 2 shown in FIG. 1. Hall-effect switches are commercially available.

A well know and widely used component, a Hall-effect switch generates a high/low signal in response to the magnetic flux density it experiences. A Hall-effect switch is designed with an operating point $B_{op}$ and a releasing point $B_{rp}$. When the magnetic flux density increases and crosses $B_{op}$, the Hall-effect switch output changes from a first state to a second state (e.g. from high to low) (sometimes referred to as trigger); it remains in the second state until the magnetic flux density decreases and crosses $B_{rp}$, at which point the Hall-effect switch output changes from the second state to the first state (sometimes referred to as reset). For a unipolar Hall-effect switch, operating point $B_{op}$ and the releasing point $B_{rp}$ are in the same direction, but $B_{op}$ is typically higher than $B_{rp}$; i.e., the Hall-effect switch exhibits a hysteresis behavior. As a result, the first and second threshold current values of the current detection and control circuit 2A are also different. The waveforms depicted in FIG. 2(c) shows a slightly lower current value corresponding to time point $t_2$ than at point $t_1$; correspondingly, the time point $t_2$ is closer to the second zero crossing point $t_3$ than the time point $t_1$ is to the first zero crossing point $t_0$.

Because the direction of the electrical current through the coil 202 will remain the same, the polarity of the magnetic field inside the gap of the core will remain the same. Thus, the Hall-effect switch used in the rectifying circuit can be a unipolar or omnipolar type (but not a bipolar type).

When designing the current detection and control circuit 2A, various parameters including the number of turns of the coil 202, the material of the core 201, the shape and size of the core 201, the size of the gap 203, the $B_{op}$ and $B_{rp}$ of the Hall-effect switch 204, etc. can be selected to achieve desired threshold current values at which the current detection and control circuit 2A will generate the control signals for the MOSFET 1. In one example, a Hall-effect switch element is selected with a $B_{op}$ of 80 gauss and a $B_{rp}$ of 70 gauss; the iron core is designed so that it produces 80 gauss flux density in the gap when the current in the coil is about 5 A and about 70 gauss flux density in the gap when the current in the coil is about 4.4 A.

Moreover, the core 201 should be designed so that its remanent magnetization (remanence) is below the releasing point $B_{rp}$ of the Hall-effect switch.

As mentioned earlier, the magnetic field generated by the core can follow a 50-60 Hz or 100 Hz current signal without significant delay. Hall-effect switches also have a fast operating speed for a 50-60 Hz or 100 Hz application. Also, Hall-effect switches typically have no upper B limit for operation.

It should be noted that most commercially available Hall-effect switch devices output a logic high signal (at the output pin relative to the ground pin) when no magnetic flux is present, and a logic low signal when it is triggered. If such a commercial device is used in the current detection and control circuit 2, a logic inverter is needed to invert its output voltage before applying it to the MOSFET. In the schematic diagram of FIG. 1, the logic inverter is a part of the current detection and control circuit 2 so that the output signal of circuit 20 is of the correct polarity as described earlier for the MOSFET operation.

The voltage supply circuit 3, sometimes referred to as the floating voltage pump, can be any suitable circuit that generates a floating DC voltage relative to the phase line L of the AC, in order to supply the operating voltage for the current detection and control circuit 2. In order to switch the N channel MOSFET to on state, the MOSFET G-S typically must be applied a positive 5V-20V voltage. Since the AC input line is connected to the MOSFET's source, a floating voltage pump is desired to generate the gate voltage.

For example, the voltage pump can employ a small power transformer, or a voltage multiplier having two or more diodes and two or more capacitors. When a transformer is used, its secondary winding is connected to the AC line on one side, and the other side will generate a pumped up voltage above the AC line, for example, 12V above the AC line. The voltage generated by the transformer can be rectified by a diode. Such a pumped up steady DC voltage will supply the Hall-effect switch as well to control the MOSFET's gate electrode.

The floating voltage pump is designed to output a DC voltage required by the Vcc of the current detection and control circuit 2 (e.g. about 12V), and designed to work with given AC input signals. In one example, when a transformer is used, its output winding voltage can be designed to be in the 12V range, and its winding parameters are designed depending on the AC input voltage. In another example, the transformer is adapted for fixed 12V input to 12V output; a voltage stabilizer circuit is used to take a 12V input from the AC source. In addition, the transformer's operating frequency design can be adapted to the AC input frequency. A transformer used in the floating voltage pump typically requires very low power, e.g. in the 0.1 W range.

As pointed out earlier, when the MOSFET 1 is turned on, its on resistance R determines the power loss on the MOSFET. To further reduce the overall resistance, multiple MOSFETs can be connected in parallel and controlled by the same control signal.

The principles described above can be applied to rectifier circuit for various types of AC input. Some examples are shown in FIGS. 4-7.

Figure 4:
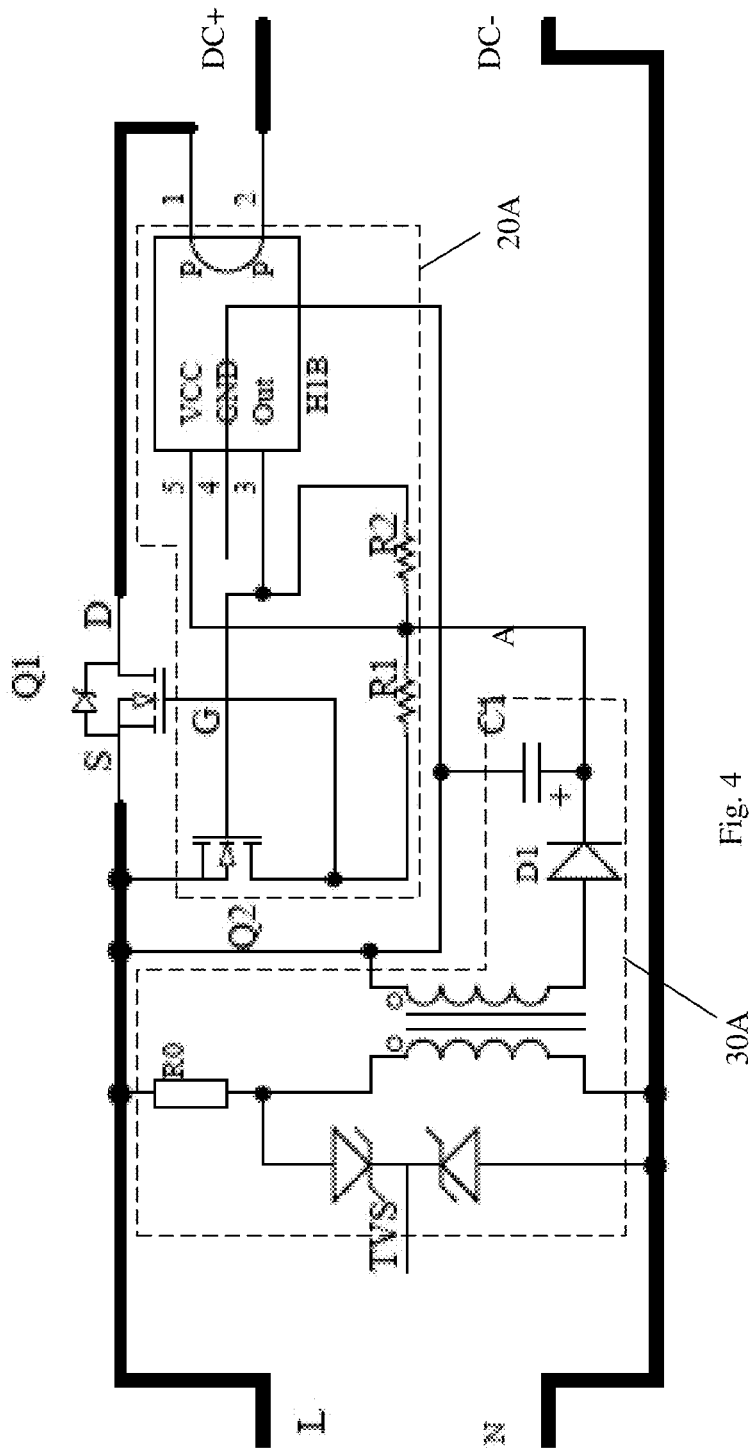
FIG. 4 schematically illustrates an active switching rectifier circuit in a single-phase half-wave configuration according to an implementation of the first embodiment.

FIG. 4 schematically illustrates an implementation of the active switching rectifier circuit of FIG. 1 for a single-phase half-wave configuration. The first MOSFET Q1 corresponds to MOSFET 1 in FIG. 1. The components in dashed box 20A (R0, TVS, Transformer, D1 and C1) form a current detection and control circuit corresponding to the circuit 2 of FIG. 1. The components in dashed box 30A (UB, Q2, R1, R2) form a floating voltage pump corresponding to circuit 3 of FIG. 1. The working principle of this circuit is generally the same as that of FIG. 1; more details of the floating voltage pump and logic inverter circuit are explained below.

The floating voltage pump 30A employs a transformer T, which is a one-to-one transformer in this example. The primary winding of the transformer is connected in series with a resistor R between the phase L and neutral N lines of the AC source, and 12V TVS (transient voltage suppressor, e.g. dual direction Zener diode) is coupled in parallel with the primary winding to stabilize the voltage across the primary winding, creating a desired AC voltage (12V in this example) for the primary winding. The secondary winding of the transformer, which outputs a 12V AC voltage in this example, has its upper end coupled to the phase line L and its lower end coupled to a the anode of a diode D. The cathode of the diode D is the output point A of the floating voltage pump, and a capacitor (10 uF in this example) is coupled between the output point A and the phase line L. Diode D and capacitor C function as a rectifier circuit to rectify the AC from the secondary winding and generate a positive DC voltage (relative to the upper end of the secondary winding) at the output point A. In other words, the voltage pump 30A generates at its output point A a floating DC voltage (12V in this example) above the voltage of the phase line L. This voltage powers the current detection and control circuit 20A.

The floating voltage pump using a transformer may be replaced with a charge pump or a voltage multiplier to generate the floating DC voltage. The circuit connection should be modifies accordingly based on the type of circuit used; for example, if a DC to DC charge pump is used, it should be connected after the MOSFET to take the DC input.

In one example, a voltage charge pump may be constructed by two capacitors and two diodes; such a circuit is practical, especially in low AC rectifier circuit like i.e. 6 to 12 VAC range. The capacitors and diodes voltage pump are also called DC voltage doubler. For example, if the input AC is 12V, after rectification to DC the primary will be 12 VDC; and after the voltage pump, the output will be 24V above the ground. When the AC voltage is in the positive half cycle, this 24V will provide a suitable pumped voltage to the MOSFET's gate during this positive 12 VAC half cycle. The maximum voltage applied to the G-S will be 24V. But when the AC voltage goes into the negative half cycle, the maximum voltage applied to the G-S will be 36V. Because the maximum G-S voltage for MOSFETs normally should be below 30V, a voltage regulator is needed after the 24V output. This may make the circuit more complex and more costly.

In the current detection and control circuit 20A, the component UB is a current detector circuit having a core with coil and a Hall-effect switch, similar to the structure shown in FIG. 3. Its ground terminal is coupled to the phase line L and its reference voltage input Vcc is coupled to the output A of the voltage pump 30A. In this implementation, the output pin 3 of the current detector circuit UB outputs a low signal when the Hall-effect switch is triggered; the second MOSFET Q2 and resistor R1 form a logic inverter circuit to invert the control signal from the circuit UB. Specifically, when the output of the detector circuit UB is low relative to its ground, the MOSFET Q2, which has its source connected to the phase line L and gate connected to the output of the detector circuit UB, is turned off. As a result, the voltage at the drain of Q2, which is coupled to the output A of the voltage pump via resistor R1, is pulled up. This drain voltage is coupled to the gate of the power MOSFET Q1, causing it to turn on. When the output of the detector circuit UB is high, Q2 turns on; the drain of Q2 is shorted to the phase line L, causing the power MOSFET Q1 to turn off. The logic inverter circuit may alternatively be formed by a commercially available IC component or other suitable components. The logic inverter circuit may be omitted if the output signal from UB has the desired polarity for controlling the MOSFET Q1.

Here R2 is a pull down load for the Hall-effect switch. Because the Hall-effect switch's output is normally high, when it is triggered, a small internal FET transistor turns on, and the resistor R2 will be the load to that transistor. R2 can be omitted depending on the requirement of the Hall-effect switch.

Figure 1A:
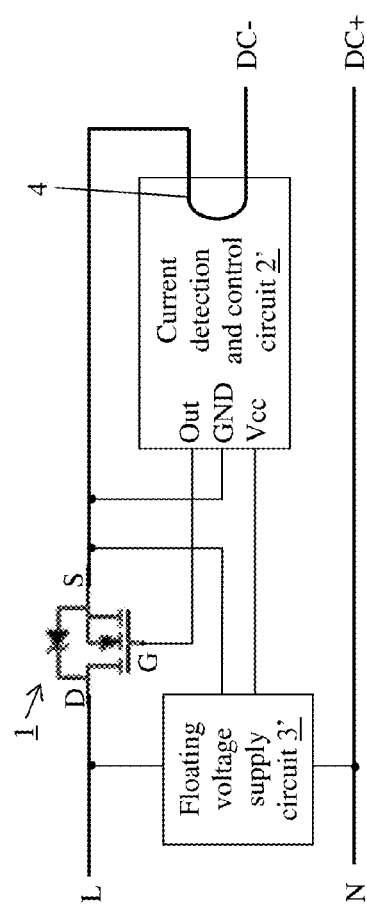
FIG. 1A schematically illustrates an active switching rectifier circuit using a MOSFET according to a variation of the first embodiment.
Figure 4A:
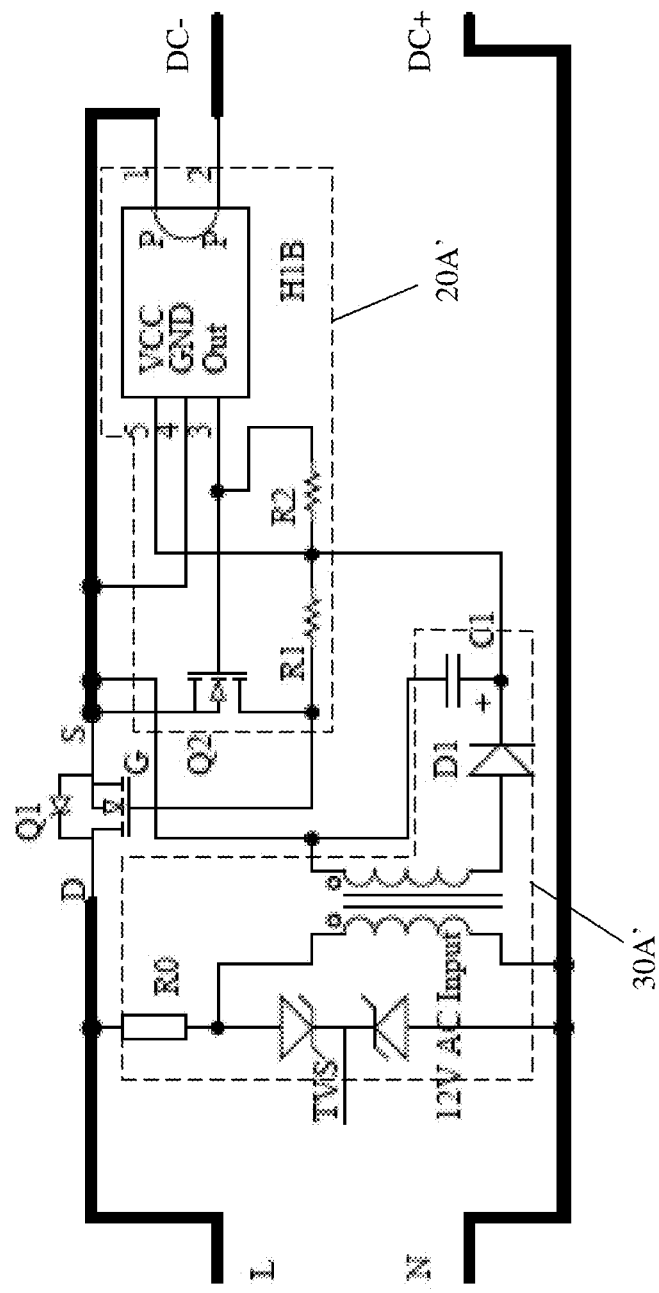
FIG. 4A schematically illustrates an active switching rectifier circuit in a single-phase half-wave configuration according to an alternative implementation of the first embodiment.

Although in the circuits of FIGS. 1 and 4 the MOSFET has its source connected on the AC side and its drain connected on the DC side, the source and drain can also be connected in the opposite direction, i.e., with the drain connected to the AC phase line L and source connected to the negative DC output, as shown in FIGS. 1A and 4A. The ground pin of the current detection and control circuit 2' and 20A' and the upper end of the secondary winding of the transformer in the voltage supply circuit 3' and 30A' are still connected to the source of the MOSFET but they are now on the DC side. Thus, the output of the current detection and control circuit 2' and 20A' will apply a G-S voltage to the MOSFET, and the voltage supply circuit 3' and 30A' will supply a floating DC voltage above the MOSFET's source voltage. The structures of the various circuit components remain substantially the same. The operating principle of these circuits remains the same, although the rectifier circuit will now work in the negative half cycles of the AC source and the polarity of the output DC voltage is reversed.

Similarly, in each of the other embodiments described below (FIGS. 5-7), the direction of each MOSFET can be reversed.

Figure 5:
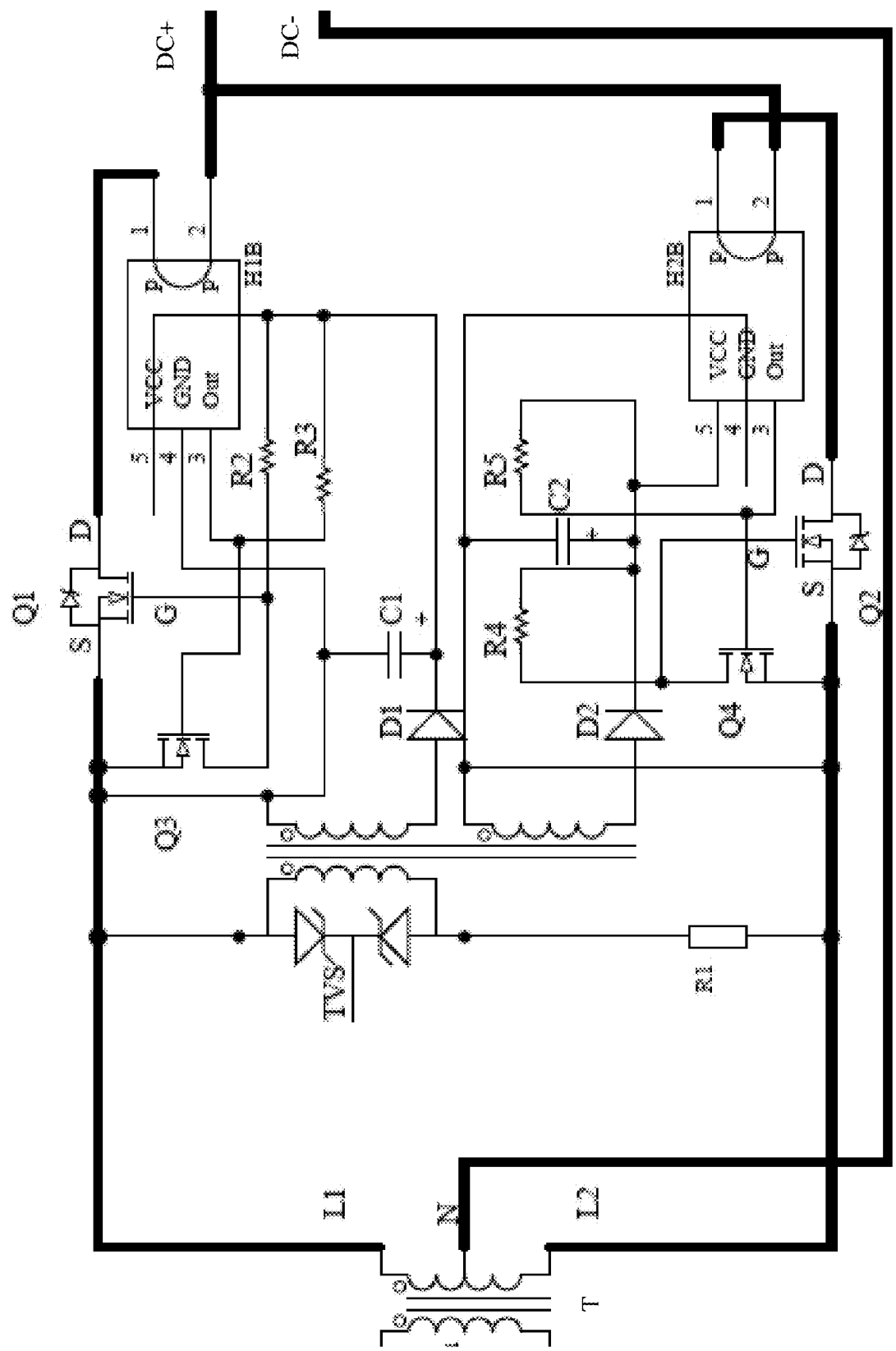
FIG. 5 schematically illustrates an active switching rectifier circuit in a center-tap, two-phases, full-wave configuration according to a second embodiment of the present invention.

FIG. 5 is a schematic diagram showing an active switching rectifier circuit according to a second embodiment of the present invention, in a center-tap, two-phases, full-wave configuration. This circuit has first and second power MOSFETs Q1 and Q2 respectively connected on the first and second phase lines L1 and L2 of the AC power source, corresponding first current detection and control circuit (H1B, Q3, R2, R3) and second current detection and control circuit (H2B, Q4, R4, R5) for controlling the first and second MOSFETs, and a floating voltage pump which separately supplies voltages to the first and second current detection and control circuits. The current detection and control circuits are similar to the current detection and control circuit 20A of FIG. 4 (e.g. components H1B and H2B are similar to UB in FIG. 4) but have their grounds respectively connected to the first and second phase lines L1 and L2.

The floating voltage pump in FIG. 5 includes a center tap dual output transformer T, transient voltage suppressor TVS, resistor R1, diode D1, capacitor C1, diode D2, and capacitor C2. Its structure and working principle are similar to the floating voltage pump 30A of FIG. 4, except that in the floating voltage pump of FIG. 5, (1) the primary winding of the transformer (with R1 and TVS) is connected between the first and second phase lines L1 and L2 rather than between phase and neutral lines, and (2) there are two independent secondary windings and two sets of diodes and capacitors (D1 and C1, D2 and C2) for rectification respectively. The floating voltage pump generates a floating DC voltage above the first phase line L1, and a floating DC voltage above the second phase line L2, to respectively supply the first and second current detection and control circuits.

Each power MOSFET and its control circuit work in the same way as explained earlier. The two MOSFETs Q1 and Q2 alternatingly conduct in the positive and negative half cycles of the AC voltage. Their outputs are combined at the DC+ terminal of the rectifier circuit, while the neutral line N (the center tap) constitutes the DC− of the rectifier circuit. This achieves full-wave rectification.

Figure 6:
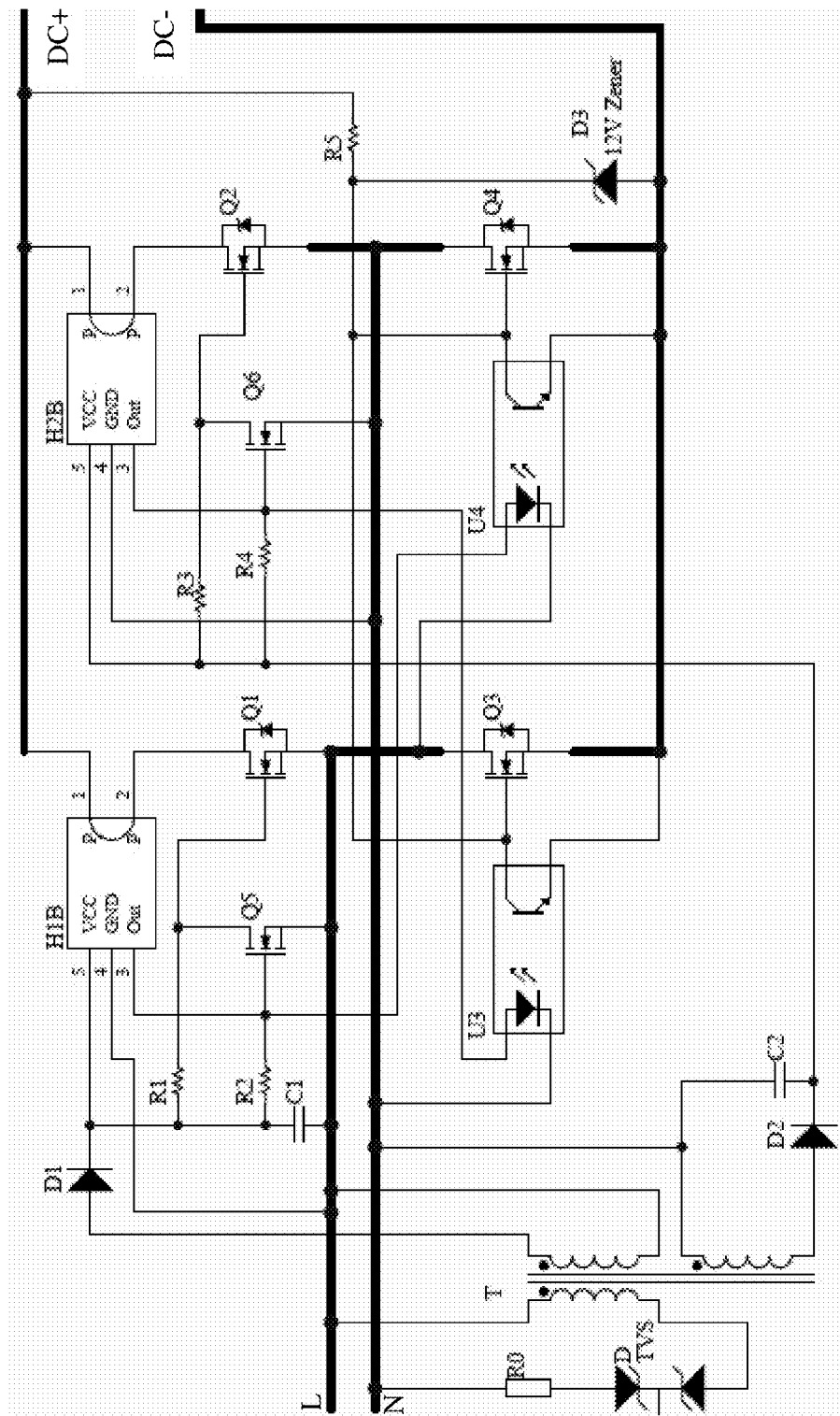
FIG. 6 schematically illustrates an active switching rectifier circuit in a single-phase, full-bridge configuration according to a third embodiment of the present invention.

FIG. 6 is a schematic diagram showing an active switching rectifier circuit according to a third embodiment of the present invention, in a single-phase, full-bridge configuration.

This circuit has first through fourth power MOSFETs Q1 to Q4, first current detection and control circuit (H1B, Q5, R1, R2) and second current detection and control circuit (H2B, Q6, R3, R4) for controlling the four MOSFETs, and a floating voltage pump (dual output transformer T, D1, C1, D2 and C2) which separately supplies the first and second current detection and control circuits.

The four MOSFETs form a full bridge: Q1 and Q4 conduct during the positive half wave of the AC source to output the voltage at the positive DC output DC+; Q2 and Q4 conduct during the negative half wave of the AC source to output the voltage at DC+.

Each current detection and control circuit is similar to the current detection and control circuit 20A of FIG. 4 (e.g. components H1B and H2B are similar to UB in FIG. 4) but have their grounds respectively connected to the L and N. The output signals of the components H1B and H2B are respectively inverted by logic inverters Q5, R1 and Q6, R3 and applied to the gates of the upper bridge MOSFETs Q1 and Q2 respectively. The circuit additionally includes first and second opto-isolators U3 and U4 which couple, in an electrically isolated manner, the output signals of the current detection circuits H2B and H1B to the gates of the lower bridge MOSFETs Q3 and Q4 respectively. Note that in this example, the opto-isolators U3 and U4 also invert the output signals of the current detection circuits H2B and H1B. For example, when the output of H1B is high (Hall-effect switch not triggered), opto-isolator U4 is turned on, bringing the gate voltage of Q4 down to its source voltage, so Q4 is turned off. When the output of H1B is low (Hall-effect switch triggered), opto-isolator U4 is turned off, the gate voltage of Q4 is high and Q4 turned is on. Resistor R5 and diode D3 (e.g. a 12V Zener diode) are connected in series across the DC output to provide the gate to source working voltage for lower bridge MOSFETs Q3, Q4 and the opto-isolators U3 and U4. U3 and U4, respectively, can also be deemed a part of the second and first current detection and control circuits, so that each circuit controls two MOSFETs.

In this manner, MOSFETs Q1 and Q4 are controlled to conduct at the same time, and MOSFETs Q2 and Q3 are controlled to conduct at the same time, so they function as a rectifier bridge.

The logic inverter circuits (Q5 and R1, and Q6 and R3) may be omitted if the output signals from components H1B and H2B have the desired polarity for controlling the MOSFETs. In such a case the designs of the opto-isolators U3 and U4 should be modified accordingly so that they do not invert the signals from H1B and H2B.

The floating voltage pump circuit in FIG. 6 includes a dual output transformer with its primary windings coupled across the single phase of the AC source. The output of the two secondary windings are rectified to generate two independent floating DC (e.g. 12V) outputs, above the voltage of the L and N, respectively, to supply the two current detection and control circuits.

The rectifier circuits shown in FIGS. 4-6 can work as independent modules without requiring any external circuits or signals, other than the AC power to be rectified. Therefore they can replace conventional power diode rectifiers. The parameters of various parts such as the power MOSFETs, the core and the Hall-effect switch, the transformer, etc. can be designed to match the input AC line voltage, current and frequency.

Figure 7:
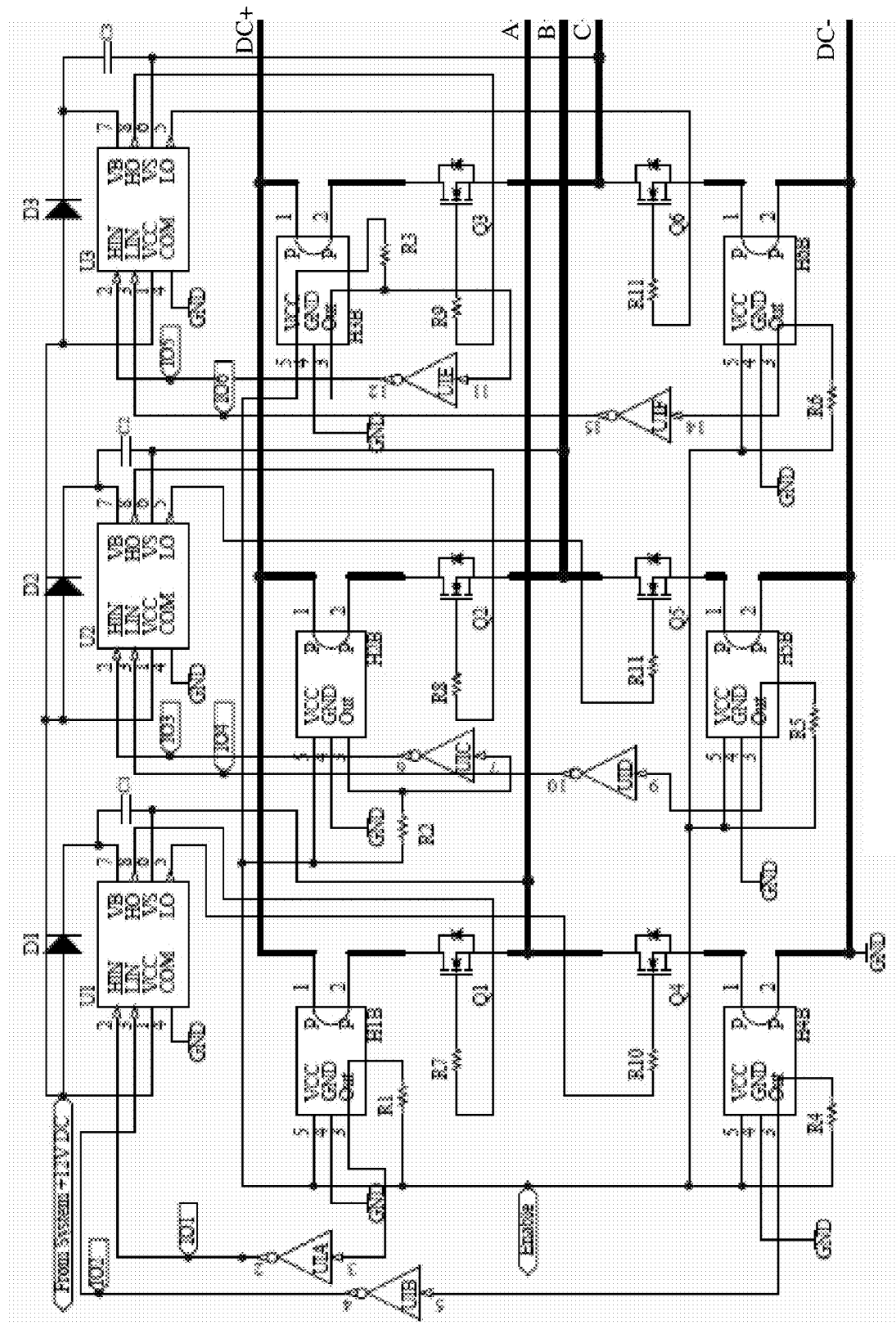
FIG. 7 schematically illustrates an active switching rectifier circuit in a three-phase, H bridge full wave configuration according to a third embodiment of the present invention.

FIG. 7 is a schematic diagram showing an active switching rectifier circuit according to a fourth embodiment of the present invention, in a three-phase, H bridge full-wave configuration. In this drawing, Lines A, B and C are the three phase lines connected to a three-phase permanent magnet (PM) motor (not shown), and DC+ and DC− are the positive and negative DC voltages.

This circuit includes six power MOSFETs Q1 to Q6 which are configured as a standard three-phase H bridge for driving a three-phase PM motor. More specifically, MOSFETs Q1, Q2 and Q3 are respectively connected between the phase lines A, B, C and DC+ with their sources connected to the phase lines; MOSFETs Q4, Q5 and Q6 are respectively connected between DC− and the phase lines A, B, C with their sources connected to DC−. This way, MOSFETs Q1 and Q4, Q2 and Q5, and Q3 and Q6 form three half bridges of the three-phase H bridge. In addition, control circuits for the MOSFETs Q1 to Q6 are provided to allow the same H bridge to act as an active switching rectifier when the PM motor, under external force, act as an alternator to produce electrical voltage and current on the three phase lines.

When the three-phase H bridge acts as a drive circuit to drive the PM motor to deliver speed and torque (referred to as the drive mode here), a DC drive voltage is applied across DC+ and DC− and a three-phase AC current is generated at the three phase lines A, B and C. In this mode, the six MOSFETs Q1 to Q6 are respectively driven by half-bridge drivers U1 to U3 (U1 drives Q1 and Q4, etc.) to turn on and off to generate the three-phase AC voltage. The drivers U1 to U3 are controlled by external control signals from a drive control MCU (microcontroller unit, not shown in the drawing) applied at three pairs of IO ports IO1 and IO4, IO2 and IO5, and IO3 and IO6. The drivers U1 to U3 are supplied by a system DC voltage source (e.g. 12V). The half-bridge drivers U1 to U3 may use, for example, IC chips model IR2103 manufactured by International Rectifier, or other suitable components. The drive mode operation of the three-phase H bridge, including the function of the drivers U1 to U3 and the drive MCU, is known to those skilled in the art and will not be described in more detail here.

When the three-phase H bridge acts as an active switching rectifier (referred to as the rectifier mode here), a three-phase AC voltage generated by the motor is applied on the phase lines A, B and C and is rectified to generate a DC output across DC+ and DC−. In this mode, the six MOSFETs Q1 to Q6 are driven by the half-bridge drivers U1 to U3, but the drivers U1 to U3 are now controlled the six current detection and control circuits H1B to H6B via the six logic inverters UI1A to UI6F. The components H1B to H6B are similar to component UB in FIG. 4. The ground pins of the components H1B to H6B are connected to ground; their Vcc pins are supplied by an external DC voltage (e.g. 5V-12V), which also serves as an enable/disable signal as will be described later. Each of the logic inverters UI1 to UI6 may be a commercially available IC component or any other suitable circuit. Note that the logic inverters UI1A to UI6F may be omitted if the output signals from H1B to H6B already have the desired polarity (i.e. low when reset and high when triggered); when the inverters are present, they may be deemed a part of the current detection can control circuit along with the corresponding components H1B to H6B.

The signals from each pair of current detection and control circuits (H1B and H4B, etc.), after inversion if required, are inputted via corresponding IO ports (IO1 and IO4, etc.) to the corresponding half-bridge drivers (U1, etc.), so as to control the two MOSFETs of the corresponding half bridges (Q1 and Q4, etc.) Note that the IO ports IO1, IO4, etc. are the same as those used by the input signals from the MCU during the drive mode.

Note that the transformers in the circuit of FIGS. 4-6 are not needed in the circuit of FIG. 7 because the components H1B to H6B are supplied by an external voltage and because the driver U1 to U3 can generate the appropriate drive voltage for the MOSFETs Q1 to Q6. In this sense the drivers U1 to U3 replaces part of the function of the transformers in the circuit of FIGS. 4-6.

The overall control circuit of FIG. 7 is switched between the drive mode and the rectifier mode by the enable signal, which is the DC voltage applied to the Vcc pins of the current detection and control circuits H1B to H6B, as well as the control signals from the MCU applied to the IO ports IO1 to IO6. To operate the circuit in the drive mode, a DC drive voltage is applied across the DC+ and DC− terminals, the enable signal is low, and the control signals are provided from the MCU to the IO ports. As a result, the current detection and control circuits H1B to H6B (with the corresponding inverters) do not operate as current detectors and will output a constant low signal, i.e., they are bypassed; the control signals from the MCU control the drivers U1 to U3 to drive the MOSFETs Q1 to Q6 to generate a three-phase AC voltage for the three phase lines A, B and C. To operate the circuit in the rectifier mode, the enable signal is high, and the control signals from the MCU are not provided. As a result, the current detection and control circuits H1B to H6B (and the corresponding inverters) operate to provide input signals for the drivers U1 to U3, to drive the MOSFETs Q1 to Q6 to rectify the three-phase AC voltage into a DC voltage on DC+ and DC−.

In the circuit of FIG. 7, the six MOSFETs Q1 to Q6 and three half-bridge drivers U1 to U3 are used for both the drive mode and the rectifier mode. Thus, a driver circuit and a rectifier circuit can be constructed without duplicating the components Q1 to Q6 and U1 to U3. This achieves significant saving. This circuit is useful, for example, in power applications where the motor sometimes acts as a motor and sometimes acts as a generator, such as in electric or hybrid cars.

In an alternative three-phase H bridge configuration, if the circuit is only required to be a rectifying circuit, the half-bridge drivers U1 to U3 may be omitted and floating voltage pumps using transformers may be used instead to supply the operating floating DC voltage to the six current detection and control circuits.

The active switching rectifier circuits according to the above embodiments of the present invention have many advantages. They can utilize the characteristics of super low on resistance of power MOSFET transistors in the AC-DC rectifying circuit. They are suited for high current, high power AC-DC rectifying and can greatly reduce the voltage drop and reduce the power loss in the rectifier circuit. Their construction is simple, reliable and can be used in many types of applications. The input AC voltage range can be from a few volts to hundreds of volts, and the amperage can be up to hundreds amps. The overall efficiency can be increased by 90% as compared to conventional diode rectification methods. The active switching rectifier circuits can be constructed as independent modules that can directly replace industrial diodes in existing applications without any additional circuit.

It will be apparent to those skilled in the art that various modification and variations can be made in the active switching rectifier circuit and related apparatus and methods of the present invention without departing from the spirit or scope of the invention. Thus, it is intended that the present invention cover modifications and variations that come within the scope of the appended claims and their equivalents.

What is claimed is:

1. A circuit for rectifying an AC voltage from an AC source to generate a DC voltage on a DC output, wherein the AC source is a single-phase AC source having a phase line and a neutral line, the circuit comprising:

only two current detection and control circuits, including a first current detection and control circuit and a second current detection and control circuit;

only two opto-isolators, including a first opto-isolator and a second opto-isolator;

a first MOSFET (Metal Oxide Semiconductor Field Effect Transistor) having its source electrode coupled to the phase line of the AC source and its drain electrode coupled to one end of the DC output for passing a current between the source and the drain electrodes;

the first current detection and control circuit having a first input current conductor which is coupled in series with the current that passes between the source and the drain electrodes of the first MOSFET, the first current detection and control circuit outputting a first switching control signal based on a current in the first input current conductor, wherein the first switching control signal is coupled to a gate electrode of the first MOSFET to turn the first MOSFET on and off;

a second MOSFET having its source electrode coupled to the neutral line of the AC source and its drain electrode coupled to the one end of the DC output for passing a current between the source and the drain electrodes;

the second current detection and control circuit having a second input current conductor which is coupled in series with the current that passes between the source and the drain electrodes of the second MOSFET, the second current detection and control circuit outputting a second switching control signal based on a current in the second input current conductor, wherein the second switching control signal is coupled to a gate electrode of the second MOSFET to turn the second MOSFET on and off;

a third MOSFET having its drain electrode coupled to the phase line of the AC source and its source electrode coupled to another end of the DC output for passing a current between the source and the drain electrodes;

a first coupling circuit including the first opto-isolator for coupling, in an electrically isolated manner, the second switching control signal generated by the second current detection and control circuit to a gate electrode of the third MOSFET to turn the third MOSFET on and off, wherein the second switching control signal controls the second and third MOSFETs to turn on and off at the same time;

a fourth MOSFET having its drain electrode coupled to the neutral line of the AC source and its source electrode coupled to the other end of the DC output for passing a current between the source and the drain electrodes;

a second coupling circuit including the second opto-isolator for coupling, in an electrically isolated manner, the first switching control signal generated by the first current detection and control circuit to a gate electrode of the fourth MOSFET to turn the third MOSFET on and off, wherein the first switching control signal controls the first and fourth MOSFETs to turn on and off at the same time; and a voltage supply circuit coupled to the phase and neutral lines of the AC source for generating a first DC operating voltage and supplying it to the first current detection and control circuit and generating a second DC operating voltage and supplying it to the second current detection and control circuit, wherein the DC voltage generated on the DC output is a full-wave DC voltage.

2. The circuit of claim 1, wherein the drain electrode of the first MOSFET is connected to a positive end of the DC output.

3. The circuit of claim 1, wherein the source electrode of the first MOSFET is connected to a negative end of the DC output.

4. The circuit of claim 1, wherein the voltage supply circuit is a floating voltage pump which generates a floating DC voltage above a voltage at the phase line of the AC source.

5. The circuit of claim 4, wherein the floating voltage pump comprises:

a transformer having a primary winding coupled between the phase line and another line of the AC source, and a secondary winding having one end coupled to the phase line of the AC source; and a diode rectifier coupled to another end of the secondary winding to generate the DC operating voltage.

6. The circuit of claim 1, wherein the first to fourth MOSFETs are N-channel power MOSFETs.

7. The circuit of claim 1, wherein the first current detection and control circuit generates the first switching control signal to turn the first MOSFET on when the current in the first input current conductor is above a first threshold value and generates the first switching control signal to turn the first MOSFET off when the current in the first input current conductor is below a second threshold value.

8. The circuit of claim 1, wherein the first current detection and control circuit further includes:

a ferromagnetic core having a C shape forming a gap, wherein the first input current conductor is wound around the core for one or more turns; and a Hall-effect switch disposed inside the gap, the Hall-effect switch changing its output state between a first state and a second state in response to a magnetic flux density in the gap of the core.

9. The circuit of claim 8, wherein the Hall-effect switch changes its output state from a high state to a low state in response to the magnetic flux density increasing to and above an operating point and changes its output state from the low state to the high state in response to the magnetic flux density decreasing to and below a releasing point, and wherein the first current detection and control circuit further includes an inverter circuit for inverting the output signal of the Hall-effect switch.

* * * * *